(12) United States Patent
Takeda (10) Patent No.: US 6,326,803 B1
(45) Date of Patent: Dec. 4, 2001

(54) TERMINATING CIRCUIT FOR A TRANSMISSION LINE

(75) Inventor: Kouji Takeda, Hiji-machi (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/695,521

(22) Filed: Oct. 24, 2000

(30) Foreign Application Priority Data

Oct. 25, 1999 (JP) .................................................. 11-302370

(51) Int. Cl.[7] .................................................. H03K 17/16
(52) U.S. Cl. .................................. 326/30; 326/86; 326/83
(58) Field of Search .................................. 326/30, 86, 83

(56) References Cited

U.S. PATENT DOCUMENTS

| 5,329,190 | * | 7/1994 | Igarashi et al. ....................... 307/540 |
| 5,726,583 | * | 3/1998 | Kaplinsky ............................... 326/30 |
| 5,739,702 | * | 4/1998 | Shigehara et al. ...................... 326/86 |
| 6,275,088 | * | 8/2001 | Jain ........................................ 327/312 |

* cited by examiner

Primary Examiner—Michael Tokar
Assistant Examiner—Anh Tran
(74) Attorney, Agent, or Firm—Bret J. Petersen; Frederick J. Telecky, Jr.

(57) ABSTRACT

A termination circuit to reduce the overshoot and undershoot that are generated when switching the voltage level of a transmission line. The terminating circuit (11) has a termination switching circuit (40) and an auxiliary switching circuit (41). When the voltage level of the termination (5) of the transmission line (4) is switched from a low level to a high level, the termination switching circuit (40) switches the termination (5) that is connected to the ground potential at a low level to the power supply voltage (Vcc) corresponding to a high level, but before that connection is completed, due to the fact that the auxiliary switching circuit (41) temporarily connects the termination (5) to the ground potential corresponding to a low level, the impedance of the terminating circuit (11) is temporarily lowered. Therefore, the overshoot and the undershoot that were generated in the past when switching the voltage level can be reduced.

3 Claims, 4 Drawing Sheets

TERMINATING CIRCUIT FOR A TRANSMISSION LINE

FIELD OF THE INVENTION

This invention relates to a terminating circuit, and specifically, relates to a terminating circuit that prevents reflection at the termination of a transmission circuit when a signal is transmitted by using a transmission line.

BACKGROUND OF THE INVENTION

Generally, when conducting the transmission and reception of a digital signal through the medium of a transmission line, if the impedance of the transmission line does not match the input impedance of the receiver side, a signal is reflected at the termination of the transmission line, and waveform distortion is created. Thus, a resistor having a resistance value equal to the impedance of the transmission line is connected between the termination of the transmission line and ground potential. By this means, reflection at the termination of the transmission line is prevented, and the transmission and reception of a digital signal without any waveform distortion becomes possible.

However, in the case of connecting a resistor between the transmission line termination and ground potential, when a signal of a high level is output on the transmission line, a current flows to the ground through the medium of the resistor, and there is a problem that the power consumption loss is great.

As a countermeasure for this, instead of a resistor, a terminating circuit using a MOSFET in place of the resistor has been proposed.

Figure 10:
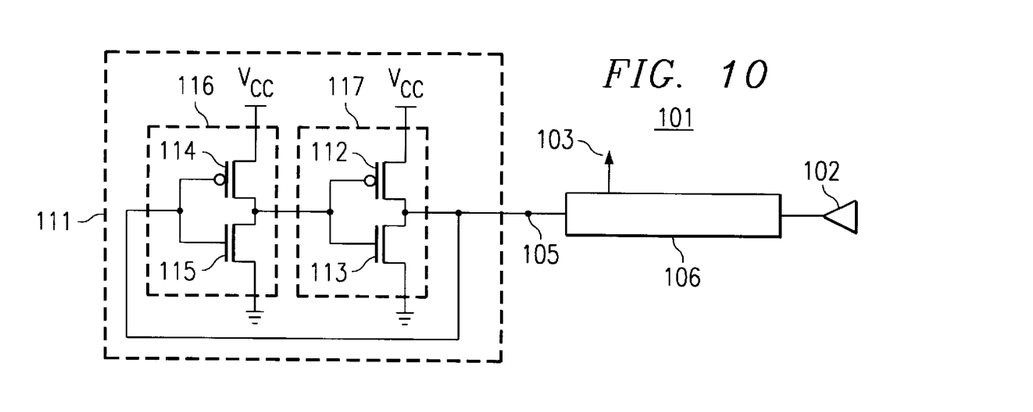
FIG. 10 is a schematic explaining a transmission circuit used in the past

Key 101 in FIG. 10 shows one example of a conventional digital transmission line. This digital transmission line has a driver 102, a receiver 103, and a transmission line 104, and is constructed so that a signal voltage that is output from the driver 102 is received at the receiver 103 through the medium of the transmission line 104.

A terminating circuit 111 is provided in this transmission circuit 101. The terminating circuit 111 has CMOS inverters 116, 117.

The CMOS inverter 116 is made of a p-channel MOS transistor 114 and an n-channel MOS transistor 115, its input terminal is connected to a termination 105 of the transmission line, and a signal corresponding to the level of the signal voltage of the termination 105 of the transmission line is output from the output terminal.

The CMOS inverter 117 is made of a p-channel MOS transistor 112 and an n-channel MOS transistor 113, [these] are respectively arranged with the p-channel MOS transistor 112 [connected to] the power supply voltage Vcc side and the n-channel MOS transistor 113 connected to the ground side, and the output terminal is connected to the transmission line termination 105, and when the output signal of the CMOS inverter 116 is at a high level, the transmission line termination 105 is connected to the ground terminal through the medium of the n-channel MOS transistor 113, and when the output signal is at a low level, the transmission line termination 105 is connected to the power supply voltage Vcc through the medium of the p-channel MOS transistor 112.

In the above-mentioned circuit 101, when the output of the driver 102 is at a constant low level, the output of the CMOS inverter 116 is at a high level and the transmission line termination 105 is in a configuration of being connected to the ground potential through the medium of the n-channel MOS transistor 113.

If the output signal of the driver 102 rises from a low level to a high level, after a delay time in the transmission line 104 has elapsed, the voltage of the transmission line termination 105 rises from a low level. When the potential of the transmission line termination 105 exceeds a high level threshold value, in response, the output signal of the CMOS inverter 116 switches from a high level to a low level, the termination 105 of the transmission line 104 is connected to the power supply voltage Vcc through the medium of the p-channel MOS transistor 112, and the potential of the transmission line termination 105 is pulled up by means of the power supply voltage Vcc.

At this time, current temporarily flows to the transmission line termination 105 from the power supply voltage Vcc through the medium of the p-channel MOS transistor 112, but when the potential of the transmission line termination 105 reaches a high level, current flow stops.

In the condition in which the potential of the transmission line termination 105 is stabilized at a high level, the transmission line termination 105 connected to the power supply voltage Vcc through the medium of the p-channel MOS transistor 112.

After that, if the driver 102 drops the output signal from a high level to a low level, a reverse operation from the operation explained above is conducted. In other words, the output signal of the CMOS inverter 116 is switched from a low level to a high level, the termination 105 of the transmission line 104 is connected to the ground potential through the medium of the n-channel MOS transistor 113, and the potential of the transmission line termination 105 is pulled down. At the time of this pulling down, current flows from the transmission line termination 105 to the ground potential side through the medium of the n-channel MOS transistor 113, and after the potential of the transmission line termination 105 reaches a low level, the current almost ceases to flow.

In this way, in the terminating circuit 111 explained above, when the potential of the transmission line termination 105 is at a high level, the termination 105 is terminated at the power supply potential Vcc, and when it is at a low level, the termination 105 is terminated at the ground potential. When switching the logic level, as explained above, a slight amount of current flows through the transmission line termination 105, but since current does not flow when the logic level of the transmission line termination 105 is fixed, the power consumption loss can be greatly reduced compared to the case when a resistor is always connected to the transmission line termination.

Also, since the ON resistance of the p-channel MOS transistor 112 of the power supply voltage Vcc side and the ON resistance of the n-channel MOS transistor 113 of the ground potential side are both predetermined so as to match the line impedance of the transmission line 104, there is no reflection at the transmission line termination 105, and waveform distortion is not generated.

However, in the above-mentioned terminating circuit 111, when the logic level is switched, a problem is created wherein a large overshoot and undershoot are generated for the input voltage of the receiver 103.

Figure 11:
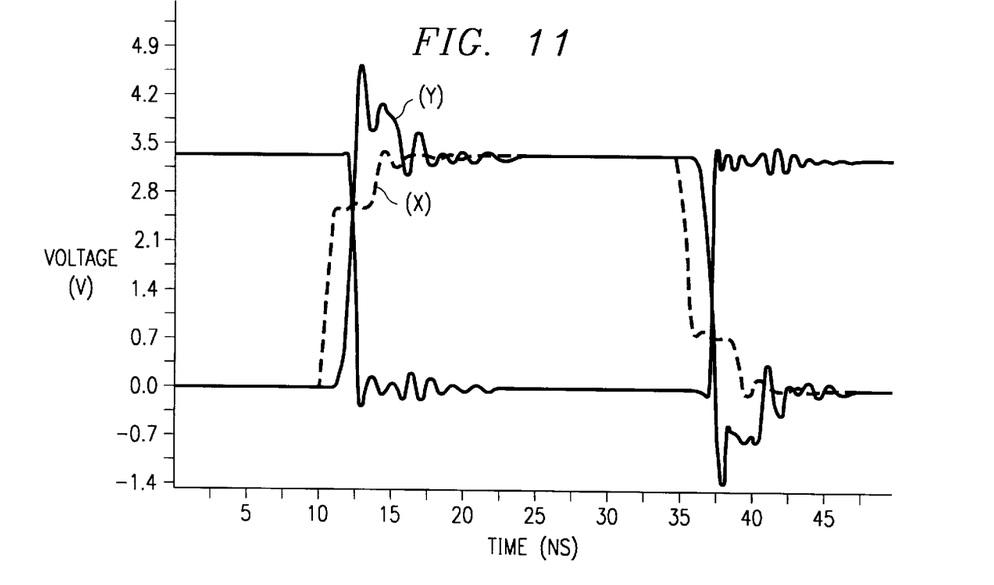
FIG. 11 is a voltage waveform diagram of the output voltage of the driver and the input voltage to the receiver in a transmission circuit used in the past

A waveform voltage diagram for the output voltage of the above-mentioned driver 102 and the input voltage for the receiver 103 are respectively shown on the curves (X) and (Y) of FIG. 11.

As shown on curve (X), when the output voltage of the driver 102 rises from a reference voltage (0 V) corresponding to a low level to the reference voltage 3.3 V corresponding to a high level, the input voltage of the receiver 103 also rises from the reference voltage 0 V corresponding to a low level to a high level. When the input voltage for the receiver 103 rises, as is shown on the curve (Y), it rises above the reference voltage 3.3 V corresponding to a high level and reaches almost 4.5 V, so it can be seen that a large overshoot is generated.

In the same manner, when the output voltage of the driver 102 drops from a reference voltage 3.3 V corresponding to a high level to a reference voltage (0 V) corresponding to a low level, as is shown on the curve (Y), the input voltage for the receiver 103 drops lower than the reference voltage (0 V) corresponding to the low level and almost reaches −1.2 V, so it can be seen that a large undershoot is generated.

This invention was achieved for the purpose of solving the unfavorable behavior of the above-mentioned prior technology, and its objective is to offer a terminating circuit that can either eliminate or reduce the overshoot and the undershoot that are generated at the termination of a transmission line, and which can terminate the transmission line.

SUMMARY OF THE INVENTION

In order to solve the above-mentioned problems, the terminating circuit recorded in claim 1 has a first switching means that is connected between a signal line that is driven at a first voltage level or a second voltage level, and a first voltage supply terminal, a second switching means that is connected between the above-mentioned signal line and a second voltage supply terminal, a first control means that places the above-mentioned first switching means in the conductive state when the above-mentioned signal line is at the above-mentioned first voltage level and places the above-mentioned second switching means in the conductive state when the above-mentioned signal line is at the second voltage level, a third switching means that is connected between the above-mentioned signal line and the above-mentioned first voltage supply terminal, a fourth switching means that is connected between the above-mentioned signal line and the second voltage supply terminal, and a second control means that places the above-mentioned third switching means temporarily in a conductive state at the time the above-mentioned signal line is shifted from the first voltage level to the second voltage level, and places the above-mentioned fourth switching means temporarily in a conductive state at the time the above-mentioned signal line is shifted from the second voltage level to the first voltage level.

Also, the terminating circuit recorded in claim 2 is the terminating circuit recorded in claim 1, wherein the above-mentioned first and second switching means are respectively constructed by a first and second transistor, the above-mentioned first control means supplies a signal of the opposite phase from the above-mentioned signal line voltage to the above-mentioned first and second transistor having a first delay time, the above-mentioned third switching means contains a third and fourth transistor that are connected in series between the above-mentioned signal line and the first voltage supply terminal, the above-mentioned fourth switching means contains a fifth and sixth transistor that are connected in series between the above-mentioned signal line and the second voltage supply terminal, the control terminal of the above-mentioned fourth and sixth transistors is connected to the above-mentioned signal line, and the above-mentioned second control means supplies a signal of the opposite phase from the above-mentioned signal line to the above-mentioned third and fifth transistors having a second delay time.

Lastly, the terminating circuit recorded in claim 3 is the terminating circuit recorded in claim 2, wherein the above-mentioned first control means is constructed by a first inverter, and the above-mentioned second control means is constructed by a second, third, and fourth inverter that are connected in series.

The terminating circuit of this invention is equipped with an auxiliary switching circuit that is constructed by a third switching means, a fourth switching means, and a second control means, and when switching the voltage level, before connecting the terminating switching circuit that is constructed by the first switching means, the second switching means, and the first control means to a voltage source corresponding to the voltage after switching the termination of the signal line (signal path), the auxiliary switching circuit connects the transmission line termination for a prescribed time to a voltage supply corresponding to the voltage level before the switching. By this means, the impedance of the terminating circuit can be temporarily lowered, and the overshoot and undershoot at the transmission line termination that have been generated in the past when switching the voltage level can be prevented.

Among the fourth and sixth transistors (first and second primary switches) and the third and fifth transistors (first and second secondary switches), the first and second primary switches are constructed so as to change state in response to the voltage level of the transmission line termination, and the first and second secondary switches [are constructed so as to] change state in response to the output of the second control means.

When the voltage level of the transmission line termination is input to the second control means, an inverted signal of that is output after being delayed exactly by the second delay time, so when the voltage level of the transmission line switches, even when the state of the first and second primary switches has switched, the state of the first and second secondary switches are maintained in the state before the switching, and only after the second delay time has elapsed are the first and second secondary switches switched.

In this way, by means of delaying the switching of the state of the first and second secondary switches after the switching of the state of the first and second primary switches by means of the second control means, the first primary switch and the first secondary switch, which do not reach the ON state at the same time during steady state, can both be placed in the ON state, and the second primary switch and the second secondary switch [which do not reach the ON state at the same time during steady state], can both be placed in the ON state, and the transmission line termination can be temporarily connected to the voltage source corresponding to the voltage level before the switching.

Since the impedance of the terminating circuit can be temporarily lowered from a fixed resistor value by means of connecting the transmission line termination for a fixed time to the voltage source corresponding to the voltage level before switching in this manner, the overshoot and the undershoot at the transmission line termination can be prevented.

REFERENCE NUMERALS AND SYMBOLS AS SHOWN IN THE DRAWINGS 11 is a terminating circuit, 12 p-channel MOS transistor, 13 n-channel MOS transistor, 16 CMOS inverter, 20 Delay circuit, 30 Switching circuit, 31 First primary switch, 32 First secondary switch, 33 Second secondary switch, 34 Second primary switch, 40 Termination switching circuit, and 41 is an auxiliary switching circuit.

DESCRIPTION OF THE EMBODIMENTS

Figure 1:
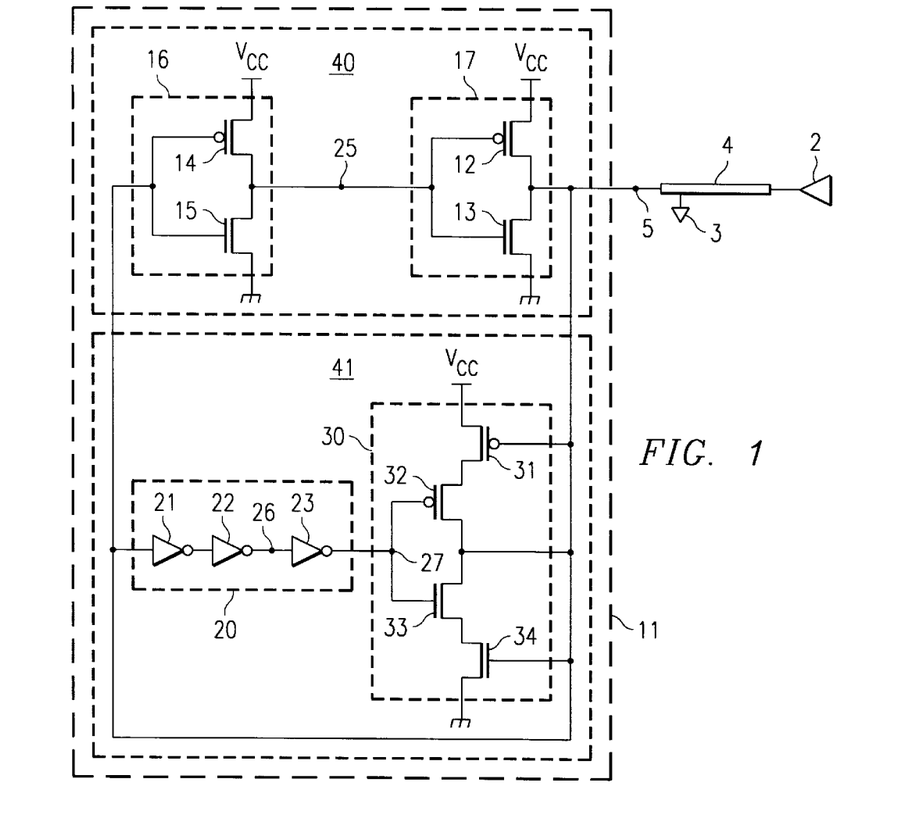
FIG. 1 is a first schematic explaining the transmission circuit of one embodiment configuration of this invention

Below, referencing the figures, an explanation will be given in regard to application embodiments of this invention. Key 1 in FIG. 1 shows one example of a digital signal transmission line of an embodiment configuration. This digital transmission line 1 has a driver 2, a receiver 3, and a transmission line 4, and the digital signal that is transmitted from the driver 2 is received at the receiver 3 through the medium of the transmission line 4.

The terminating circuit 11 is provided in this transmission line 1. This terminating circuit 11 has the termination switching circuit 40, and the auxiliary switching circuit 41.

The termination switching circuit 40 has the CMOS inverters 16, 17. Among these, the CMOS inverter 16 is made up of a p-channel MOS transistor 14 and an n-channel MOS transistor 15, its input terminal is connected to the transmission line termination 5, and the voltage level of the transmission line termination 5 is inverted and output from the output terminal.

The CMOS inverter 17 is made up of a p-channel MOS transistor 12 and an n-channel MOS transistor 13, and the p-channel MOS transistor 12 is arranged at the power supply voltage Vcc side, and the n-channel MOS transistor 13 at the ground potential side, respectively.

The input terminal of the CMOS inverter 17 is connected to the output of the CMOS inverter 16, the output terminal of the CMOS inverter 17 is connected to the transmission line termination 5, and when the output signal of the CMOS inverter 16 is at a high level, the p-channel MOS transistor 12 and the n-channel MOS transistor 13 are in an OFF state and ON state, respectively, and the transmission line termination 5 is connected to the ground potential through the medium of the n-channel MOS transistor 13, and on the other hand, when the output signal is at a low level, the p-channel MOS transistor 12 and the n-channel MOS transistor 13 are in the ON state and the OFF state, respectively, and the transmission line termination 5 is connected to the power supply voltage Vcc through the medium of the p-channel MOS transistor 12.

The secondary switching circuit 41 has the delay circuit 20 and the switching circuit 30.

The delay circuit 20 is constructed of the three inverter stages 21, 22, 23, its input is connected to the transmission line termination 5, and after the voltage level of the transmission line termination 5 has been inverted and delayed the prescribed time, it is output to the switching circuit 30.

The switching circuit 30 has the first and second primary switches 31, 34, and the first and second secondary switches 32, 33. Among these, the first primary switch 31 and the first secondary switch 32 are both constructed by a p-channel MOS transistor, and the second primary switch 32 and the second secondary switch 33 are both constructed by an n-channel MOS transistor.

The first and second primary switches 31, 34, and the first and second secondary switches 32, 33 are respectively series connected, and construct series connected circuits.

One terminal of the series connected circuit of the first primary switch 31 and the first secondary switch 32, and one terminal of the series connected circuit of the second primary switch 34 and the second secondary switch 33, are connected to the power supply voltage Vcc and the ground potential, respectively, and the other terminal of the series connected circuit of the first primary switch 31 and the first secondary switch 32, and the other terminal of the series connected circuit of the second primary switch 34 and the second secondary switch 33, are both connected to the transmission line termination 5.

In the series connected circuit of the first primary switch 31 and the first secondary switch 32, the first primary switch 31 is connected to the power supply voltage Vcc side, and the first secondary switch 32 is arranged at the termination 5 side. On the other hand, in the series connected circuit of the second primary switch 34 and the second secondary switch 33, the second primary switch 34 is connected to the ground potential side, and the second secondary switch 33 is arranged at the termination 5 side.

The gate terminals for the first and second primary switches 31, 34 are connected to the transmission line termination 5, and the voltage of the transmission line termination 5 is input. On the other hand, each gate terminal of the first and second secondary switches 32, 33 are connected to the output terminal of the delay circuit 20, and the voltage of the transmission line termination 5 that is inverted by the delay circuit 20 is input.

In the above-mentioned switching circuit 30, in the condition in which the voltage level of the transmission line termination 5 is stabilized hereinafter, called a low level steady state), since a low level is input to the gate terminals of the first and second primary switches 31, 34, and a high level is input to the gate terminals of the first and second secondary switches 32, 33, the first and second primary transistors [sic; switches] 31, 34 that are made up of a p-channel MOS transistor and an n-channel MOS transistor, respectively, are in the ON state and the OFF state, respectively, and the first and second secondary transistors [sic; switches] respectively made up of a p-channel MOS transistor and an n-channel MOS transistor are in the OFF state and ON state, respectively.

Due to the fact that the first primary switch 31 and the first secondary switch are in the ON state and OFF state, respectively, and the second primary switch 34 and the second secondary switch 33 are in the OFF state and the ON state, respectively, at a low level steady state, the transmission line termination 5 is not connected to the power supply voltage Vcc through the medium of the series connected circuit of the first primary switch 31 and the first secondary switch 32, and is also not connected to the ground potential through the medium of the series connected circuit of the second primary switch 34 and the second secondary switch 33.

In the same manner as above, in the state in which the voltage level of the transmission line of the termination 5 is stabilized at a high level (hereinafter, called a high level steady state), since the first primary switch 31 and the first secondary switch 32 are in the OFF state and the ON state, respectively, and the second primary switch 34 and the second secondary switch 33 are in the ON state and the OFF state, respectively, the transmission line termination 5 is not connected to the power supply voltage Vcc through the medium of the series connected circuit of the first primary switch 31 and the first secondary switch 32, and is also not connected to the ground potential through the medium of the series connected circuit of the second primary switch 34 and the second secondary switch 33.

As was explained above, since the first primary switch 31 and the first secondary switch 32 are constructed by the same [type of] p-channel MOS transistor, and voltages of mutually inverse logic levels are input to each gate terminal of the first primary switch 31 and the first secondary switch 32, in a steady state, the first primary switch 31 and the first secondary switch 32 are not in the ON state. In the same manner, since the second primary switch 34 and the second secondary switch 33 are constructed by the same [type of] n-channel MOS transistor, and voltages of mutually inverse logic levels are input to each gate terminal of the second primary switch 34 and the second secondary switch 33, in a steady state, the second primary switch 34 and the second secondary switch 33 are not in the ON state.

Therefore, in a steady state of either a low level or a high level, the transmission line termination 5 is not connected to the power supply voltage Vcc through the medium of the series connected circuit of the first primary switch 31 and the first secondary switch 32, nor is it connected to the ground potential through the medium of the series connected circuit of the second primary switch 34 and the second secondary switch 33.

In the transmission line 1 of the above-mentioned construction, in a low level steady state in which the output of the driver 2 is stabilized at a low level, as was explained above, the first and second primary switches 31, 34 are in the ON state and OFF state, respectively, the first and second secondary switches 32, 33 are in the OFF state and the ON state, respectively, and the p-channel MOS transistor 12 and the n-channel MOS transistor 13 are in the OFF state and the ON state, respectively.

Figure 2:
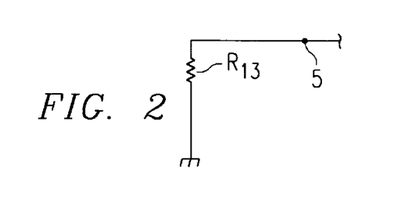
FIG. 2 is a first diagram explaining a condition in which the impedance of the terminating circuit of this invention changes

Therefore, the transmission line termination 5 is connected with the resistance value $R_{13}$ of the ON resistance of the n-channel MOS transistor 13 through the medium of the n-channel MOS transistor 13, and its equivalent circuit is as shown in FIG. 2.

When the driver 2 increases the low output from this type of low level steady state to a high level, after the delay time in the transmission line 4 has elapsed, the voltage level of the transmission line termination 5 increases from a low level to a high level. By this means, the first and second primary switches 31, 34 that were in the ON state and OFF state, respectively, with the low level steady state, switch to the OFF state and the ON state, respectively.

At the point in time at which the states of the first and second primary switches 31, 34 have switched, since the first and second secondary switches 32, 33 are held in the OFF state and the ON state, respectively, the first primary switch 31 and the first secondary switch 32 both are in the OFF state, and the second primary switch 34 and the second secondary switch 33 both are in the ON state.

Figure 3:
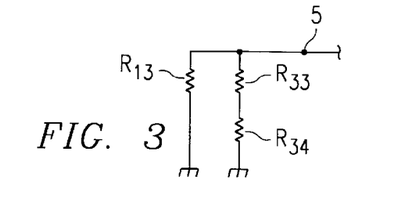
FIG. 3 is a second diagram explaining a condition in which the impedance of the terminating circuit of this invention changes

Due to the fact that the second primary switch 34 and the second secondary switch 33 both are in the ON state in this manner, the transmission line termination 5 is connected to the ground potential through the medium of the series connected circuit of the second secondary switch 33 and the second primary switch 34. Due to this, the potential of the transmission line termination 5 is further pulled down to the ground potential side, and along with the transmission line termination 5 being connected to the ground potential through the resistance value $R_{13}$ of the ON resistance of the n-channel MOS transistor 13 through the medium of the n-channel MOS transistor 13, it is also connected to the ground potential by the sum of the resistance values $R_{33}$, $R_{34}$ ($R_{33}+R_{34}$) of the ON resistance valve of each switch 33, 34 through the medium of the second secondary switch 33 and the second primary switch 34, and the equivalent circuit is as shown in FIG. 3.

In this state, because the ON resistance $R_{12}$ of the n-channel MOS transistor 12 and the on resistance ($R_{33}+R_{34}$) of the series connected switches 33, 34 are connected in parallel, the impedance of the terminating circuit 11 drops lower than the impedance $R_{13}$ at the time when the voltage level of the transmission line termination 5 is stabilized at a low level. Due to the fact that the impedance of the terminating circuit 11 is lowered in this manner, the overshoot that is generated at the time of the rise is reduced.

The voltage of the termination 5 that has risen to a high level is also input to the CMOS inverter 16, and after being inverted at the CMOS inverter 16, is output to the CMOS inverter 17. After the output signal of the CMOS inverter 16 switches from a high level to a low level, the low level is output to the common gate terminal for the p-channel MOS transistor 12 and the n-channel MOS transistor 13.

By this means, at the time the voltage of the transmission line termination 5 is in a steady state that is at a low level, the p-channel MOS transistor 12 and the n-channel MOS transistor 13 that were in the OFF state and the ON state, respectively, are switched to the ON state and the OFF state, respectively, [with such switching] delayed by exactly the operating time of the CMOS inverter 16, and the transmission line termination 5, along with being switched from the ground potential, is connected to the power supply voltage Vcc through the medium of the p-channel MOS transistor 12.

Figure 4:
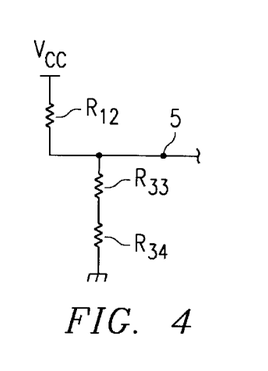
FIG. 4 is a third diagram explaining a condition in which the impedance of the terminating circuit of this invention changes

At this point in time, the transmission line termination 5, along with being connected to the power supply voltage Vcc through the resistance value $R_{12}$ of the ON resistance of the p-channel MOS transistor 12 through the medium of the p-channel MOS transistor 12, is connected to the ground potential by the sum of the resistance values $R_{33}$, $R_{34}$ ($R_{33}+R_{34}$) of the on resistance of each switch 33, 34 through the medium of the second secondary switch 33 and the second primary switch 34, and the equivalent circuit is as shown in FIG. 4.

The voltage of the termination 5 that has risen to a high level is input to the delay circuit 20. The delay circuit 20 inverts to a low level the voltage of the transmission line termination 5 that has been switched to a high level, that low level is delayed a prescribed time, and the output of the CMOS converter 16, after being switched to a low level, is output to the gate terminal for the first and second secondary switches 32, 33.

Figure 5:
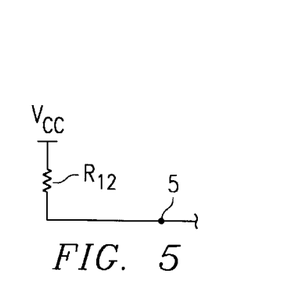
FIG. 5 is a fourth diagram explaining a condition in which the impedance of the terminating circuit of this invention changes

When a low level is output from the delay circuit 20, the first and second secondary switches 32, 33 are switched to the ON state and the OFF state, respectively, and the transmission line termination 5 that is connected to the ground potential through the medium of the second secondary switch 33 and the second primary switch 34 is disconnected from the ground potential, and shifted to a high level steady state. An equivalent circuit when the voltage of the transmission line termination 5 is in a steady state at a high level is shown in FIG. 5. After that, each switch 31 to 34, and the p-channel MOS transistor and the n-channel MOS transistor 12, 13 are held at a high level steady state until the voltage level of the transmission line termination 5 is again switched to a low level.

As was explained above, in the terminating circuit 11 of this embodiment configuration, when the output of the driver 2 rises from a low level to a high level, in the delay circuit 20, due to the fact that the switching of the ON/OFF state of the first and second secondary switches 32, 33 is delayed by more than the switching of the ON state and the OFF state of the first and second primary switches 31, 34, the second secondary switch 33 and the second primary switch 34 are both placed in the ON state, and since the transmission line termination 5 can be temporarily connected to the ground potential through the medium of the switches 33, 34, the impedance of the terminating circuit 11 is temporarily lowered, and the overshoot can be reduced.

In the above, an explanation was given for a case wherein the output of the driver (2) rose from a low level to a high level, but in the case of the output dropping from a high level to a low level, the operations are conducted in a reverse direction from the above.

In a high level steady state, as was mentioned above, the first primary switch 31 and the first secondary switch 32 are in the OFF state and the ON state, respectively, the second secondary switch 33 and the second primary switch 34 are in the OFF state and the ON the state, respectively, the p-channel MOS transistor 12 and the n-channel MOS transistor 13 are in the ON state and the OFF state, respectively, and the transmission line termination 5 is in the configuration of being connected to the power supply voltage (Vcc) through the medium of the p-channel MOS transistor 12.

If the output of the driver 2 switches to a low level from this state, the voltage level of the transmission line termination 5 switches to a low level, and the first and second primary switches 31, 34 are switched to the ON state and the OFF state, respectively.

At the point in time at which the state of the first and second primary switches 31, 34 are switched, since the output of the delay circuit 20 is held at a low level, the first and second secondary switches 32,33 are held in the ON state and the OFF state, respectively. Therefore, the first primary switch 31 and the first secondary switch 32 both are in the ON state, and the second primary switch 34 and the second secondary switch 33 both are in the OFF state.

Thus, due to the fact that the first primary switch 31 and the first secondary switch 32 are both in the ON state, the transmission line termination 5 is connected to the power supply voltage Vcc through the medium of the series connected circuit of the first secondary switch 32 and the first primary switch 31, and the potential of the transmission line termination 5 is pulled up to the power supply voltage Vcc side.

Therefore, since the impedance of the terminating circuit 11 is decreased to less than the impedance in a high level stabilized state, the undershoot that is generated when switching from a high level to a low level can be reduced.

The voltage of the transmission line termination 5 is also input to the CMOS inverter 16, and after the voltage of the transmission line termination 5 has switched from a high level to a low level, the output of the CMOS inverter 16 switches from a low level to a high level, the p-channel MOS transistor 12 and the n-channel MOS transistor 13, which were respectively in the ON state and the OFF state in a high level steady state, are switched to the OFF state and the ON state, respectively, and along with [the output of the CMOS inverter 16] being switched from the power supply voltage Vcc, it is connected to the ground potential through the medium of the n-channel MOS transistor 13.

After the output of the CMOS inverter is switched from a high level to a low level, the output of the delay circuit 20 is inverted to a high level, the first and second secondary switches 32, 33 are switched to the OFF state and the ON state, respectively, and the transmission line termination 5 that was connected to the power supply voltage Vcc through the medium of the first primary switch 31 and the first secondary switch 32 is disconnected from the power supply voltage Vcc, and is placed in the configuration of being connected to the ground potential through the medium of the n-channel MOS transistor 13, in other words, it is placed in a low level steady state.

Figure 6:
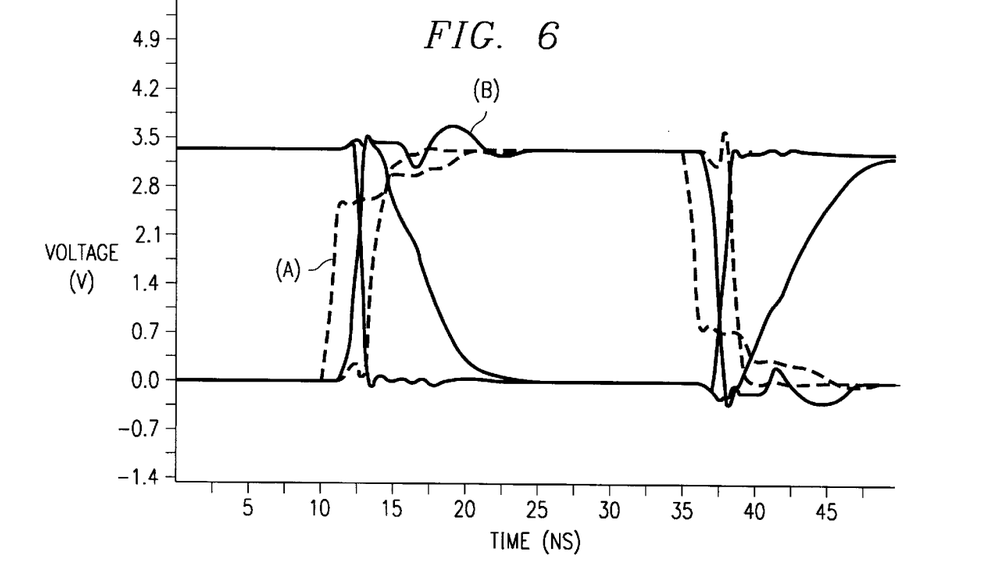
FIG. 6 is a voltage waveform diagram of the output voltage of the driver and the input voltage to the receiver in a transmission circuit of this invention

In FIG. 6, a voltage waveform diagram in each section of the above-mentioned transmission line 1 is shown. In FIG. 6, the curve (A) shows the output voltage of the driver 2, and the curve (B) shows the input voltage to the receiver 3.

As is shown in curve (A), when the output voltage of the driver 2 rises from the reference voltage 0 V corresponding to a low level to the reference voltage 3.3 V corresponding to a high level, the input voltage to the receiver 3 also rises from the reference voltage 0 V corresponding to a low level, to a high level. When the input voltage to the receiver 3 rises as is shown in the curve (B), it rises above the reference voltage 3.3 V corresponding to a high level, but that rise is slight, no more than about 3.5 V, and after that it attenuates and stabilizes at the reference voltage 3.3 V corresponding to the high level. Therefore, compared to the past in which the input voltage to the receiver 103 rose to about 4.5 V at the time of the rise, it can be seen that the overshoot is decreased by a wide margin.

In the same manner, when the output voltage of the driver 2 drops from the reference voltage 3.3 V corresponding to a high level to the reference voltage 0 V corresponding to a low level, the input voltage to the receiver 3 drops to less than 0 V, but does not drop to less than about −0.2 V, and after that attenuates and stabilizes at 0 V. Therefore, compared to the past in which the input voltage to the receiver 103 dropped to about −1.2 V at the time of the drop, it can be seen that the undershoot is reduced by a wide margin.

Figure 7:
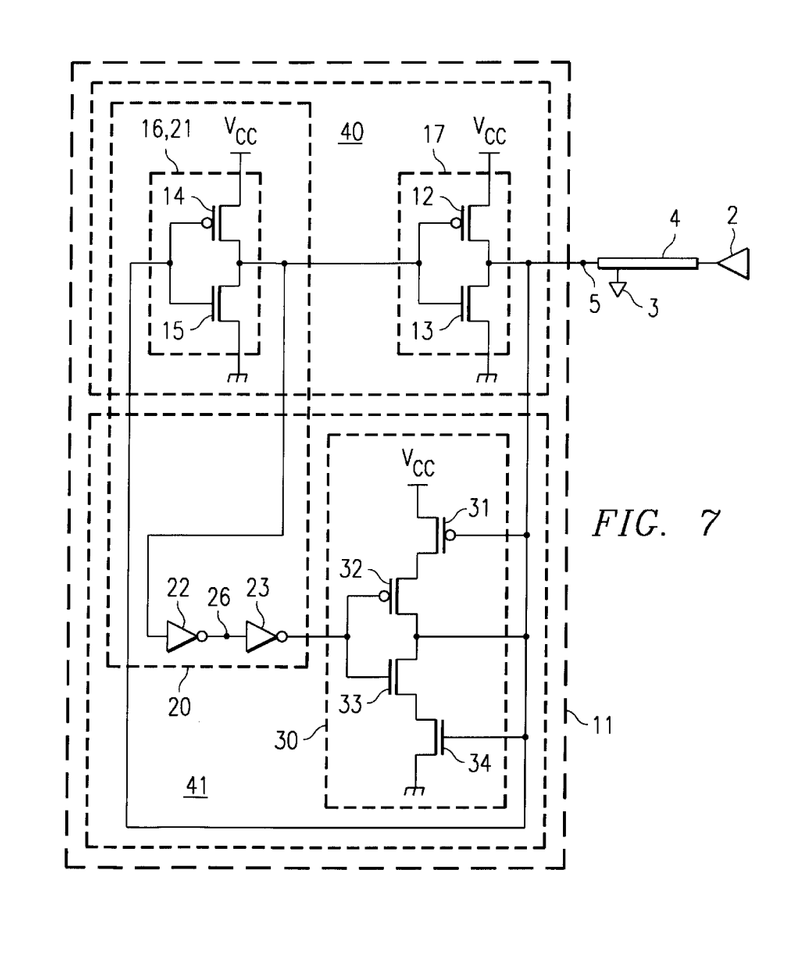
FIG. 7 is a second schematic explaining a transmission circuit of one embodiment configuration of this invention

In the above-mentioned configuration embodiment, the delay circuit 20 has the three stages of inverters 21, 22, 23, and along with converting the voltage of the transmission line termination 5 it outputs it to the switch circuit 30 by delaying it a prescribed time, but this invention is not limited to this; for example, as shown in FIG. 7, the inverter 21 of the foremost stage of the delay circuit 20 can also be constructed in common with the CMOS inverter 16.

Figure 8:
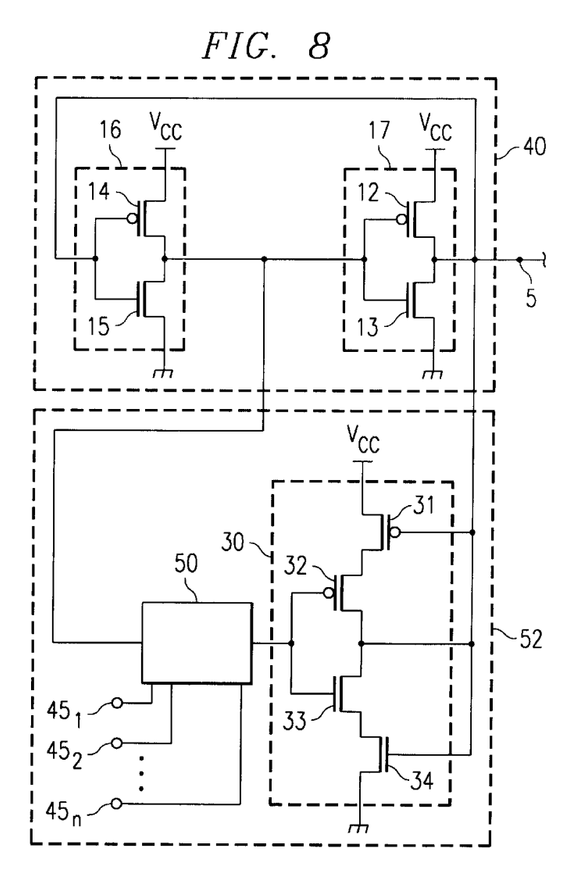
FIG. 8 is a schematic explaining the terminating circuit of another embodiment configuration of this invention

A terminating circuit of another embodiment configuration of this convention is shown as key 51 of FIG. 8. This terminating circuit 51 is different from the terminating circuit 11 of FIG. 1 in that a programmable delay circuit 50 is provided in place of the delay circuit 20.

This programmable delay circuit 50 is the same as the delay circuit 20 shown in FIG. 7 in that its input terminal is connected to the output terminal of the CMOS inverter 16, its output terminal [is connected] to the common gate terminal for the first and second secondary switches 32, 33, respectively, and the output signal of the CMOS inverter 16 after being delayed a prescribed time, is output to the common gate terminal for the first and second secondary switches 32, 33.

However, the programmable delay circuit 50 has n units of control terminals $45_1$ to $45_n$, and the delay time can be optionally set in response to control signals that are input to these control terminals $45_1$ to $45_n$. Therefore, it is different from the delay circuit 20 of FIG. 7 that is constructed by the two stages of inverters 21, 22 in which the delay time is fixed so a suitable delay time can be easily set, and it has the advantage that it can be made to correspond to transmission lines 4 of various length.

Figure 9:
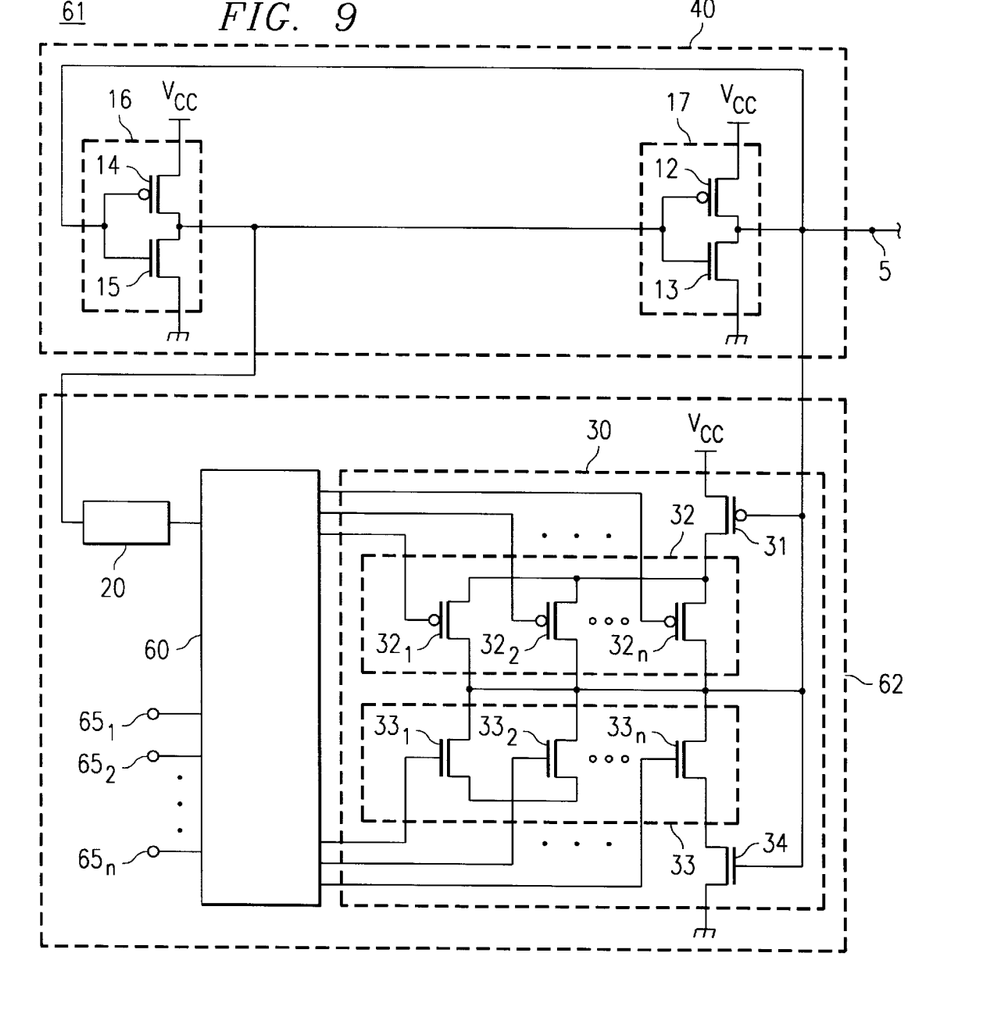
FIG. 9 is a schematic explaining a terminating circuit of another embodiment configuration of this invention

One example of a terminating circuit of another embodiment configuration of this invention is shown by the key 61 of FIG. 9. This terminating circuit 61 is different from the terminating circuit 11 shown in FIG. 1 in that n units of p-channel MOS transistors $32_1$ to $32_n$ that are connected in parallel are provided as a first secondary switch 32, n units of n-channel MOS transistors $33_1$ to $33_n$ that are connected in parallel are provided as the second secondary switch 33, and a programmable impedance control circuit 60 is now provided.

The programmable impedance control circuit 60 has one input terminal, 2n units of output terminals, and n units of control terminals $65_1$ to $65_n$. This programmable impedance control circuit 60 selects a prescribed number of first and second secondary switches $32_1$ to $32_n$, $33_1$ to $33_n$ according to control signals that are input from the control terminals $65_1$ to $65_n$, the output signal of the CMOS inverter 16 that is inverted and delayed at the delay circuit 20 is output to the terminals of the selected switches, and a prescribed number of switches can be placed in the ON state.

For example, if the first primary switch 31 and the first secondary switch 32 are both placed in the ON state, since the selected first secondary switch can be placed in the ON state by selecting a prescribed number among the first secondary switches $32_1$ to $32_n$, a synthetic impedance that is constructed by the on resistance of the first primary switch 31 and the on resistance of the first secondary switch 32 can be adjusted in response to control signals.

Therefore, a suitable synthetic impedance can be easily set in response to the drive capabilities of the driver 2. Above, an explanation was given in regard to a case wherein the first primary switch 31 and the first secondary switch 32 were both in the ON state, but it is also the same in the case wherein the second primary switch (34) and the second secondary switch 33 are both in the ON state.

In the above-mentioned embodiment configurations, the CMOS inverter 16 was arranged in the stage preceding the p-channel MOS transistor 12 and the n-channel MOS transistor 13, and the ON state and OFF state of the p-channel MOS transistor 12 and the n-channel MOS transistor 13 could be switched by the output signal of the CMOS inverter 16, but this invention is not limited to this, and can also be a construction in which the switching of the ON state and OFF state of the p-channel MOS transistor 12 and the n-channel MOS transistor 13 is possible in response to the voltage level of the transmission line termination 5.

Also, in the above-mentioned embodiment configurations, the first primary switch 31 and the first secondary switch 32 were constructed using p-channel MOS transistors, and the second drive switch 34 and the second secondary switch 33 were constructed using n-channel MOS transistors, but another construction can be used, as long as it is a construction wherein the first and second primary switches 31, 34 operate in response to the voltage of the transmission line termination 5 and conduct mutually opposite phase operation in the steady state, and the first and second secondary switches 32, 33 operate in response to the voltage of a phase opposite the voltage of the transmission line termination (5), and operate in mutually opposite phase.

The overshoot and undershoot that are generated during the switching of voltage level can be reduced.

What is claimed is:

1. A terminating circuit for a transmission line comprising, a first switching means that is connected between a signal line that is driven at a first voltage level or a second voltage level, and a first voltage supply terminal, a second switching means that is connected between the above-mentioned signal line and a second voltage supply terminal, a first control means that places the above-mentioned first switching means in the conductive state when the above-mentioned signal line is at the above-mentioned first voltage level, and places the above-mentioned second switching means in the conductive state when the above-mentioned signal line is at the second voltage level, a third switching means that is connected between the above-mentioned signal line and the above-mentioned first voltage supply terminal, a fourth switching means that is connected between the above-mentioned signal line and the second voltage supply terminal, and a second control means that places the above-mentioned third switching means temporarily in a conductive state at the time the above-mentioned signal line is shifted from the first voltage level to the second voltage level, and places the above-mentioned fourth switching means temporarily in a conductive state at the time the above-mentioned signal line is shifted from the second voltage level to the first voltage level.

2. A terminating circuit recorded in claim 1 wherein the above-mentioned first and second switching means are respectively constructed by a first and second transistor, the above-mentioned first control means supplies a signal of the opposite phase from the above-mentioned signal line voltage to the above-mentioned first and second transistor having a first delay time, the above-mentioned third switching means contains a third and fourth transistor that are connected in series between the above-mentioned signal line and the first voltage supply terminal, the above-mentioned fourth switching means contains a fifth and sixth transistor that are connected in series between the above-mentioned signal line and the second voltage supply terminal, the control terminal of the above-mentioned fourth and sixth transistors is connected to the above-mentioned signal line, and the above-mentioned second control means supplies a signal of the opposite phase from the above-mentioned signal line to the above-mentioned third and fifth transistors having a second delay time.

3. The terminating circuit according to claim 2 wherein the above-mentioned first control means is constructed of a first inverter, and the above-mentioned second control means is constructed of a second, third, and fourth inverter that are connected in series.

* * * * *